(12) United States Patent
Fujinaga

(10) Patent No.: US 10,535,581 B2
(45) Date of Patent: Jan. 14, 2020

(54) MODULE FOR HEAT GENERATING ELECTRONIC COMPONENT

(71) Applicant: Murata Manufacturing Co., Ltd., Kyoto (JP)

(72) Inventor: Kentaro Fujinaga, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/598,593

(22) Filed: May 18, 2017

(65) Prior Publication Data

US 2017/0256474 A1    Sep. 7, 2017

Related U.S. Application Data

(63) Continuation of application No. PCT/JP2015/082078, filed on Nov. 16, 2015.

(30) Foreign Application Priority Data

Nov. 21, 2014 (JP) ................. 2014-236309

(51) Int. Cl.
*H01L 23/36* (2006.01)
*H01L 23/31* (2006.01)
(Continued)

(52) U.S. Cl.
CPC ...... *H01L 23/3675* (2013.01); *H01L 23/3121* (2013.01); *H01L 23/49822* (2013.01);
(Continued)

(58) Field of Classification Search
CPC ......... H01L 23/36; H01L 23/31; H01L 23/49; H01L 23/55
(Continued)

(56) References Cited

U.S. PATENT DOCUMENTS 6,309,956 B1 * 10/2001 Chiang ............. H01L 21/76801
257/E21.576
6,399,897 B1 * 6/2002 Umematsu ........ H01L 23/49822
174/261
(Continued)

FOREIGN PATENT DOCUMENTS

JP    H09-331004 A    12/1997
JP    2000-058741 A    2/2000
(Continued)

OTHER PUBLICATIONS

English translation of JP2004047866.*
(Continued)

*Primary Examiner* — Sheikh Maruf
(74) *Attorney, Agent, or Firm* — Pearne & Gordon LLP

(57) ABSTRACT

A module 1a includes an electronic component 3a, and also includes a wiring substrate 2 on one principal surface of which the electronic component 3a is mounted and in which a radiator 4 for dissipating heat generated from the electronic component 3 is provided. The radiator 4 includes a heat dissipation section 4a that is provided so that a part thereof is exposed to a side surface of the wiring substrate 2. In this case, because the heat dissipation section 4a is provided so that a part thereof is exposed to the side surface of the wiring substrate 2, the heat from the electronic component 3a can be dissipated through the side surface of the wiring substrate 2.

9 Claims, 5 Drawing Sheets

(51) Int. Cl.
*H01L 23/49* (2006.01)
*H01L 23/367* (2006.01)
*H01L 23/498* (2006.01)
*H01L 23/552* (2006.01)
*H01L 23/00* (2006.01)

(52) U.S. Cl.
CPC .. *H01L 23/49827* (2013.01); *H01L 23/49838* (2013.01); *H01L 23/552* (2013.01); *H01L 24/32* (2013.01); *H01L 24/97* (2013.01); *H01L 2224/32225* (2013.01); *H01L 2924/14* (2013.01); *H01L 2924/19105* (2013.01)

(58) Field of Classification Search
USPC .......................................................... 257/659
See application file for complete search history.

(56) References Cited

U.S. PATENT DOCUMENTS

| | | | | |
|---|---|---|---|---|
| 6,518,660 | B2* | 2/2003 | Kwon | H01L 23/49838 257/691 |
| 2002/0000327 | A1* | 1/2002 | Juso | H01L 23/3128 174/250 |
| 2002/0063305 | A1* | 5/2002 | Koike | H01L 23/5254 257/529 |
| 2004/0152234 | A1* | 8/2004 | Usui | H01L 21/4846 438/106 |
| 2005/0263846 | A1* | 12/2005 | Inoue | H01L 21/4857 257/531 |
| 2006/0103017 | A1* | 5/2006 | Usui | H01L 23/528 257/725 |
| 2006/0204733 | A1* | 9/2006 | Murai | C23C 28/00 428/209 |
| 2006/0267176 | A1* | 11/2006 | Offrein | H01L 23/3121 257/691 |
| 2008/0093727 | A1* | 4/2008 | Weidner | H01L 23/29 257/700 |
| 2008/0210462 | A1* | 9/2008 | Kawagishi | H01L 21/561 174/377 |
| 2009/0032914 | A1* | 2/2009 | Kwon | H01L 21/4857 257/664 |
| 2009/0283299 | A1* | 11/2009 | Suzuki | H05K 1/0207 174/251 |
| 2010/0213607 | A1* | 8/2010 | Smeys | H01L 21/4853 257/723 |
| 2010/0230789 | A1* | 9/2010 | Yorita | H01L 23/3121 257/659 |
| 2011/0248389 | A1* | 10/2011 | Yorita | H01L 23/3677 257/659 |
| 2011/0309481 | A1* | 12/2011 | Huang | H01L 21/563 257/659 |
| 2012/0181696 | A1* | 7/2012 | Sun | H01L 21/486 257/758 |
| 2012/0187551 | A1* | 7/2012 | Kushino | H01L 21/561 257/659 |
| 2012/0256318 | A1* | 10/2012 | Sawada | H01L 25/0657 257/773 |
| 2012/0279760 | A1* | 11/2012 | Sun | H01L 33/642 174/252 |
| 2013/0299219 | A1 | 11/2013 | Chisaka et al. | |
| 2014/0210059 | A1* | 7/2014 | Brodsky | H01L 23/295 257/659 |
| 2015/0048490 | A1* | 2/2015 | Harashima | H01L 23/552 257/659 |
| 2015/0076670 | A1* | 3/2015 | Pan | H01L 23/3737 257/659 |
| 2015/0126134 | A1* | 5/2015 | Lobianco | H05K 9/0026 455/73 |
| 2015/0228554 | A1* | 8/2015 | Rollin | H01P 3/06 257/659 |
| 2015/0255401 | A1* | 9/2015 | Yanagida | H01L 23/552 257/659 |
| 2015/0364400 | A1* | 12/2015 | Dando | H01L 23/481 257/774 |
| 2016/0013155 | A1* | 1/2016 | Chung | H01L 25/0657 257/659 |
| 2016/0035678 | A1* | 2/2016 | Yoo | H01L 23/552 257/659 |
| 2016/0056127 | A1* | 2/2016 | Lee | H01L 25/0657 257/659 |
| 2016/0099214 | A1* | 4/2016 | Dalal | H01L 23/3121 257/692 |
| 2016/0133579 | A1* | 5/2016 | Akiba | H01L 23/552 257/659 |
| 2016/0155713 | A1* | 6/2016 | Kim | H01L 23/645 257/659 |
| 2016/0300778 | A1* | 10/2016 | Nishijima | H01L 23/057 |
| 2016/0379933 | A1* | 12/2016 | Scanlan | H05K 1/0216 257/659 |
| 2017/0079128 | A1* | 3/2017 | Wang | H01L 21/6835 |
| 2017/0301628 | A1* | 10/2017 | Kawabata | H01L 24/97 |

FOREIGN PATENT DOCUMENTS

| | | | |
|---|---|---|---|
| JP | 2004-047866 | A | 2/2004 |
| JP | 2004047866 | A * | 2/2004 |
| JP | 2005-191435 | A | 7/2005 |
| JP | 2005-347359 | A | 12/2005 |
| JP | 2006-237073 | A | 9/2006 |
| JP | 2006-351952 | A | 12/2006 |
| JP | 2009-194000 | A | 8/2009 |
| JP | 2009-277784 | A | 11/2009 |
| WO | 2008-111408 | A1 | 6/2010 |
| WO | 2012/111711 | A1 | 8/2012 |

OTHER PUBLICATIONS

International Search Report issued in Patent Application No. PCT/JP2015/082078 dated Jan. 26, 2016.

Written Opinion issued in Patent Application No. PCT/JP2015/082078 dated Jan. 26, 2016.

Japanese Notice of Reasons for Rejection for JP Application No. 2016-560201, dated Sep. 11, 2018.

* cited by examiner

MODULE FOR HEAT GENERATING ELECTRONIC COMPONENT

This is a continuation of International Application No. PCT/JP2015/082078 filed on Nov. 16, 2015 which claims priority from Japanese Patent Application No. 2014-236309 filed on Nov. 21, 2014. The contents of these applications are incorporated herein by reference in their entireties.

BACKGROUND OF THE DISCLOSURE

Field of the Disclosure

The present disclosure relates to modules in which electronic components are mounted in or on wiring substrates, and specifically relates to a module in which a radiator for dissipating heat generated from an electronic component is provided in or on a wiring substrate.

Description of the Related Art

Among modules mounted in or on a mother board or the like of an electronic apparatus, there exists a module in which an electronic component is mounted in or on a wiring substrate. In this type of module, a heat generation component such as an IC or the like is used for an electronic component in some cases. Because the heat generated from the heat generation component may affect characteristics of other electronic components inside the module, other components mounted together in or on the mother board, and the like, a heat dissipation measure is required to be taken for the heat generation component.

As such, modules in which a heat dissipation mechanism is provided in or on a wiring substrate have been proposed. For example, a module 100 disclosed in Patent Document 1 includes, as shown in FIG. 7, a wiring substrate 101 formed by laminating a plurality of insulation layers, an IC 102 mounted on an upper surface of the wiring substrate 101, and a surface mount device 103. Further, a heat dissipation mechanism is provided inside the wiring substrate 101. The heat dissipation mechanism is configured of a conductor film 104 disposed immediately under the IC 102 and a plurality of via conductors 105 (generally called "thermal vias") that are provided passing through the wiring substrate 101 under the conductor film 104. The conductor film 104 has a function to transfer the heat generated from the IC 102 to the via conductors 105. With this heat dissipation mechanism, because the heat generated from the IC 102 is transferred through the via conductors 105 disposed immediately under the IC 102 and dissipated to the exterior of the module 100, it is possible to suppress the influence of the heat generation of the IC 102 on other components.

Patent Document 1: Japanese Unexamined Patent Application Publication No. 2005-191435 (see paragraphs 0038-0050, FIG. 1, and so on)

BRIEF SUMMARY OF THE DISCLOSURE

However, in the existing module 100, the via conductors 105 serving as heat dissipation paths are provided passing through the wiring substrate 101 immediately under the IC 102. In this case, since the heat of the IC 102 is passes through the inside of the wiring substrate 101 in a concentrated manner, there arises an issue that the heat is likely to be accumulated inside the wiring substrate 101.

The present disclosure is conceived in consideration of the above issue, and an object of the disclosure is to make it difficult, in a module in which an electronic component is mounted in or on a wiring substrate, for the heat generated from the electronic component to accumulate in the wiring substrate by a heat dissipation mechanism in the module to dissipate the heat generated from the electronic component.

To accomplish the above object, a module according to the present disclosure includes a wiring substrate formed by laminating a plurality of insulation layers; an electronic component mounted on one principal surface of the wiring substrate; and a radiator that is provided in or on the wiring substrate and electrically insulated from the electronic component while a part of the radiator being in contact with the electronic component, wherein the radiator includes a heat dissipation section formed of a passing-through conductor passing through at least one of the insulation layers, and the heat dissipation section is provided so that a part of the heat dissipation section is exposed to a side surface of the wiring substrate.

In this case, since the wiring substrate is provided with the radiator as a heat dissipation mechanism, the heat from the electronic component can be dissipated with the radiator. Further, because the heat dissipation section of the radiator is provided so that a part thereof is exposed to the side surface of the wiring substrate, the heat from the electronic component can be dissipated through the side surface of the wiring substrate. In other words, it is unnecessary to provide thermal vias passing through the wiring substrate immediately under the electronic component like in the existing technique, which makes it possible to suppress the accumulation of heat inside the wiring substrate in the process of dissipating the heat from the electronic component.

The module may further include an electromagnetic shield member for the electronic component, and the part of the heat dissipation section may be in contact with the electromagnetic shield member. Because the electromagnetic shield member is generally formed with a material having high thermal conductivity, the heat dissipation efficiency of the heat from the electronic component can be improved by the heat dissipation section by making a contact with the electromagnetic shield member.

It is preferable for the radiator to include a heat transfer section that is disposed at a position near the one principal surface of the wiring substrate and transfers the heat from the electronic component to the heat dissipation section. In this case, formed is a heat dissipation path in which the heat from the electronic component is transferred to the heat dissipation section through the heat transfer section, which makes it possible to efficiently dissipate the heat with the radiator. Further, because the heat transfer section is disposed at a position near the one principal surface of the wiring substrate, the degree of freedom in designing a wiring pattern inside the wiring substrate can be increased in comparison with the existing configuration in which thermal vias passing through the wiring substrate are provided.

The heat transfer section may include an in-plane conductor formed on a boundary between one of the insulation layers that forms the one principal surface of the wiring substrate and another one of the insulation layers adjacent to the above one of the insulation layers, and the in-plane conductor may be connected to the heat dissipation section. With this, the in-plane conductor can be disposed near the one principal surface of the wiring substrate. Accordingly, in the case where the heat dissipation section is disposed on a circumferential portion of the wiring substrate and connected to the in-plane conductor, the degree of freedom in designing a wiring pattern inside the wiring substrate can be increased in comparison with the existing configuration in which thermal vias passing through the wiring substrate are provided.

The radiator may include a connection section configured to connect the heat dissipation section and a ground electrode for external connection that is formed on the other principal surface of the wiring substrate. With this, in the case where the module is mounted on the mother board, the heat from the electronic component can be transferred to the mother board side through the ground electrode. Further, in the case where the radiator is connected to the electromagnetic shield member, the shield characteristics with respect to the electronic component can be improved due to the electromagnetic shield member.

According to the present disclosure, because the radiator as a heat dissipation mechanism is provided in or on the wiring substrate, the heat from the electronic component can be dissipated with the radiator. Further, because the heat dissipation section of the radiator is disposed with a part thereof being exposed to a side surface of the wiring substrate, the heat of the electronic component can be dissipated through the side surface of the wiring substrate. In other words, it is unnecessary to provide thermal vias passing through the wiring substrate immediately under the heat generation component like in the existing technique, which makes it possible to suppress the accumulation of heat inside the wiring substrate during the heat from the electronic component being dissipated.

DETAILED DESCRIPTION OF THE DISCLOSURE

<First Embodiment>

Figure 1:
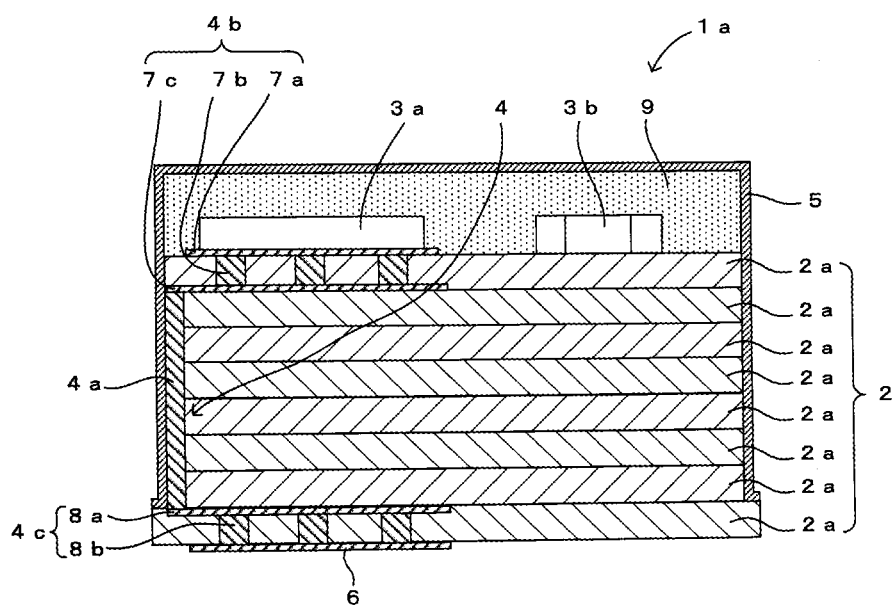
FIG. 1 is a cross-sectional view of a module according to a first embodiment of the present disclosure.

A module $1a$ according to a first embodiment of the present disclosure will be described with reference to FIG. 1. FIG. 1 is a cross-sectional view of the module $1a$. Note that in FIG. 1, a part of a wiring pattern formed in a wiring substrate 2 is omitted.

The module $1a$ according to the first embodiment includes, as shown in FIG. 1, the wiring substrate 2, a plurality of electronic components $3a$ and $3b$ mounted on an upper surface of the wiring substrate 2 (corresponds to "one principal surface of the wiring substrate" of the present disclosure), a radiator 4 provided in the wiring substrate 2, and an electromagnetic shield member 5 for the electronic components $3a$ and $3b$. The module $1a$ is mounted in an electronic apparatus such as a cellular phone using a high frequency signal, and the like.

The wiring substrate 2 is formed in a multilayer structure configured of a plurality of insulation layers $2a$ being laminated. On a lower surface of the wiring substrate 2 (corresponds to "the other principal surface of the wiring substrate" of the present disclosure), a ground electrode 6 for external connection is formed. As a material for forming the insulation layers $2a$, a glass epoxy resin, ceramics, or the like can be used, for example. In this embodiment, low temperature co-fired ceramic (LTCC) is used as the material for forming the insulation layers $2a$.

The electronic components $3a$ and $3b$ are a semiconductor device (IC) formed with Si, GaAs or the like, or a surface mount device of a chip component such as a chip capacitor, chip inductor, chip resistor, and the like. In the embodiment, the electronic component $3a$ is configured of an IC, which is a heat generation component.

The radiator 4 forms a heat dissipation path to dissipate the heat generated from the electronic component $3a$, and includes a heat dissipation section $4a$, a heat transfer section $4b$ to transfer the heat of the electronic component $3a$ to the heat dissipation section $4a$, and a connection section $4c$ for connecting the heat dissipation section $4a$ to the ground electrode 6.

The heat transfer section $4b$ is formed of a contact conductor film $7a$, a plurality of via conductors $7b$, and a heat transfer conductor film $7c$. The contact conductor film $7a$ is formed in a mounting region of the electronic component $3a$ on the upper surface of the wiring substrate 2. The electronic component $3a$ is fixed to the contact conductor film $7a$ with an adhesive, solder, or the like, and the electronic component $3a$ is in a state of being in contact or almost in contact with the contact conductor film $7a$. As such, the contact conductor film $7a$ functions as an inlet when the heat from the electronic component $3a$ is transferred through the radiator 4. The via conductors $7b$ are formed, immediately under the electronic component $3a$, in the insulation layer $2a$ in the uppermost layer (corresponds to "one insulation layer that forms one principal surface of the wiring substrate" of the present disclosure), and each upper end thereof is connected to the contact conductor film $7a$.

The heat transfer conductor film $7c$ is an in-plane conductor formed on a boundary between the insulation layer $2a$ in the uppermost layer and the insulation layer $2a$ adjacent to the insulation layer $2a$ in the uppermost layer (second insulation layer from top). To the heat transfer conductor film $7c$, each lower end of the via conductors $7b$ is connected, and the heat transfer conductor film $7c$ is connected to the heat dissipation section $4a$. The contact conductor film $7a$ and the heat transfer conductor film $7c$ can be formed by, for example, screen printing using a conductive paste containing metal such as Cu, Al, or the like. Further, each of the via conductors $7b$ can be formed by filling a via hole provided in the insulation layer $2a$ with a conductive paste containing Cu, Al, or the like, or by performing via-filling plating on the via hole. The arrangement position of the heat transfer conductor film $7c$ is not limited to the case discussed above, and it is sufficient for the film to be disposed at a position near the upper surface of the wiring substrate 2. Here, a "position near the upper surface of the wiring substrate 2" means a position on the upper surface side relative to the middle in a thickness direction of the wiring substrate 2.

The heat dissipation section $4a$ is arranged in close proximity to a side surface of the wiring substrate 2, and is provided so that a part of the heat dissipation section $4a$ is exposed to the side surface of the wiring substrate 2. In the present embodiment, the heat dissipation section $4a$ is formed of a passing-through conductor that has a column-like shape passing through a plurality of layers of the insulation layers $2a$ (six layers in this embodiment), and an upper end of the heat dissipation section $4a$ is connected to the heat transfer conductor film 7c while a lower end thereof is connected to a connection conductor film 8a to be explained later. The heat dissipation section 4a is formed with a typical conductor, such as Cu, Al, or the like, used for forming wiring electrodes.

The connection section 4c is configured of the connection conductor film 8a connected to the lower end of the heat dissipation section 4a and a plurality of via conductors 8b for connecting the connection conductor film 8a and the ground electrode 6. The connection conductor film 8a is an in-plane conductor formed on a boundary between the insulation layer 2a in the lowermost layer that forms the lower surface of the wiring substrate 2 and the insulation layer 2a adjacent to the insulation layer 2a in the lowermost layer (second insulation layer 2a from bottom), and is formed with the same material and by the same method as the other conductor films 7a and 7c. Each of the via conductors 8b is formed in the insulation layer 2a in the lowermost layer, and an upper end thereof is connected to the connection conductor film 8a while a lower end thereof is connected to the ground electrode 6. The via conductors 8b are also formed with the same material and by the same method as the above-described via conductors 7b. In the embodiment, although the radiator 4 is in contact or almost in contact with the electronic component 3a at a portion of the contact conductor film 7a, it is electrically insulated from the electronic component 3a.

On the upper surface of the wiring substrate 2, there is formed a sealing resin layer 9 for sealing the electronic components 3a and 3b, for example. As a resin to form the sealing resin layer 9, a typical material, such as an epoxy resin or the like, that seals electronic components can be used, for example. The sealing resin layer 9 can be formed by an application method, a printing method, a compression mold method, a transfer mold method, or the like.

The electromagnetic shield member 5 is provided covering a surface of the sealing resin layer 9 and the side surface of the wiring substrate 2, and blocks unwanted electromagnetic waves toward the electronic components 3a and 3b mounted on the upper surface of the wiring substrate 2. The electromagnetic shield member 5 is formed of, for example, a metal film, a conductive resin film, or the like. Further, the electromagnetic shield member 5 is configured to make contact with a portion of the heat dissipation section 4a exposed from the side surface of the wiring substrate 2 so as to establish electric connection, thereby making it possible for the heat from the electronic component 3a to be dissipated through the electromagnetic shield member 5. In other words, in the present embodiment, the electromagnetic shield member 5 is used not only as a member to block the unwanted electromagnetic waves, but also as a member to dissipate the heat from the electronic component 3a. Furthermore, the electromagnetic shield member 5 is electrically connected to the ground electrode 6 via the radiator 4 so as to be grounded. In the case where the electromagnetic shield member 5 is formed of a metal film, it can be formed by a sputtering method. Meanwhile, in the case where the electromagnetic shield member 5 is formed of a conductive resin, it can be formed by, for example, a spin coat method or the like.

With the configuration as discussed above, in the module 1a, there are formed a path in which the heat generated from the electronic component 3a is dissipated from the electromagnetic shield member 5 through the radiator 4 and a path in which the above heat is dissipated, through the radiator 4, to the mother board connected to the ground electrode 6.

(Manufacturing Method for Module 1a)

Next, an example of a manufacturing method for the module 1a will be described with reference to FIGS. 2A, 2B, 2C and 2D. Hereinafter, a case in which an aggregation of a plurality of modules 1a is formed and thereafter individualization of the modules 1a is performed to form a single module 1a will be described. Note that in FIGS. 2A, 2B, 2C and 2D, only two modules 1a adjacent to each other in the aggregation are illustrated.

First, the wiring substrate 2 is prepared. In the present embodiment, the insulation layers 2a are formed with ceramics, and the wiring substrate 2 is formed through a typical manufacturing method for a ceramic multilayer substrate, that is, through processes of preparation of ceramic green sheets (insulation layers 2a), lamination of the sheets, pressure bonding, and firing.

In preparing the ceramic green sheets, the via conductors 7b, 8b and other via conductors are formed in the respective sheets by a well-known method. Further, various types of in-plane conductors including the contact conductor film 7a, the heat transfer conductor film 7c, the connection conductor film 8a, and the ground electrode 6 are respectively formed on principal surfaces of the predetermined sheets. These in-plane conductors can be formed by, for example, screen printing using a conductive paste containing a metal filler such as Cu, Al, or the like. A via conductor 10 having a larger diameter than the via conductors 7b and 8b are formed in each of the sheets, excluding the sheets in the uppermost and lowermost layers, at a position striding a dicing line DL. Each via conductor 10 is laminated, when the sheets are laminated, to form a continuous body of the via conductors 10, which constitutes a base of the heat dissipation section 4a of each of the modules 1a adjacent to each other.

Figure 2A:
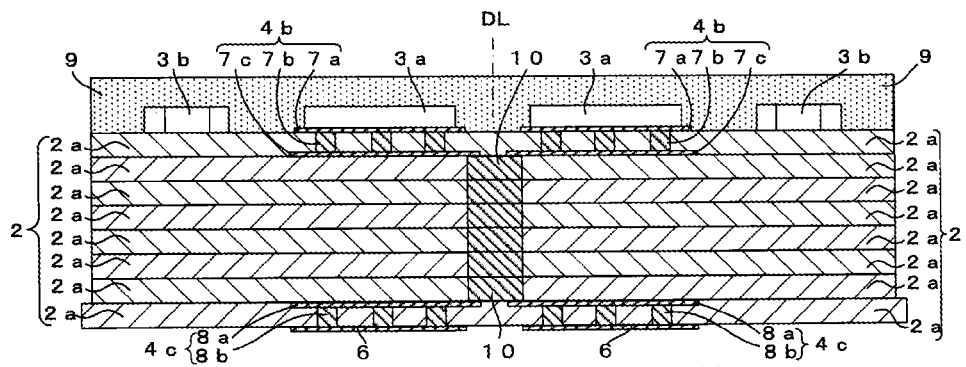
FIGS. 2A, 2B, 2C and 2D include diagrams for explaining a manufacturing method for the module shown in FIG. 1.

After having completed the wiring substrates 2 by firing the respective sheets, the electronic components 3a and 3b are surface-mounted thereon (see FIG. 2A).

Figure 2B:
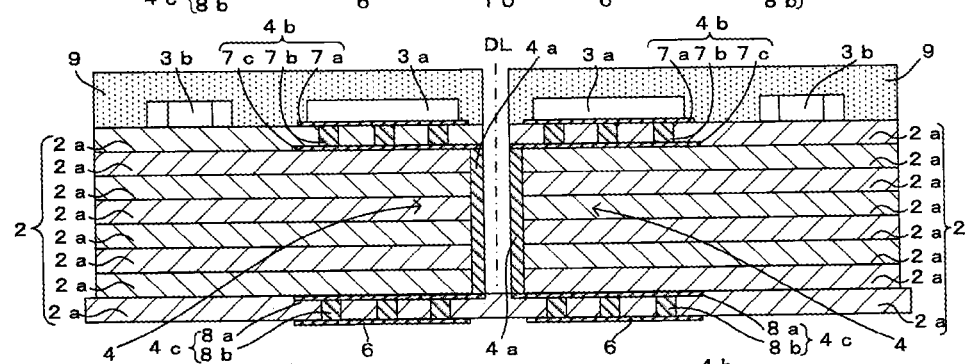

Next, as shown in FIG. 2B, half-cutting is performed with a dicing machine along the dicing line DL. In the embodiment, the cutting is performed with the dicing machine while making the insulation layers 2a in the lowermost layer remain uncut. In this case, the continuous body of the via conductors 10 is longitudinally cut in an approximately uniform manner so that the heat dissipation sections 4a is formed with a part thereof being exposed from the side surface of the wiring substrate 2. An exposure surface of the heat dissipation section 4a and the side surface of the wiring substrate 2 form the same plane; in other words, these surfaces are formed being flush with each other.

Figure 2C:
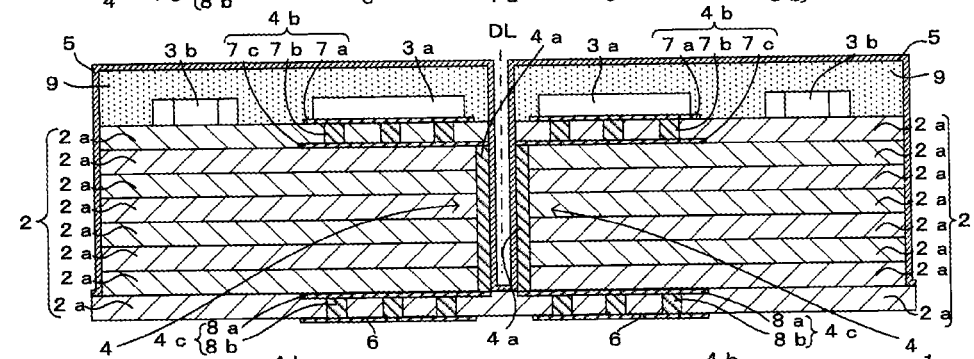

Next, as shown in FIG. 2C, the electromagnetic shield members 5 are so formed as to cover the surfaces of the sealing resin layers 9 and the side surfaces of the wiring substrates 2. The electromagnetic shield member 5 can be formed with a metal film or a conductive resin film; in the case of using a metal film, the shield member can be formed by a sputtering method, for example; in the case of using a conductive resin film, the shield member can be formed by a spin coat method, for example. By the electromagnetic shield member 5 being formed so as to also cover the exposure surface of the heat dissipation section 4a, the electromagnetic shield member 5 and the heat dissipation section 4a are electrically connected to each other.

Figure 2D:
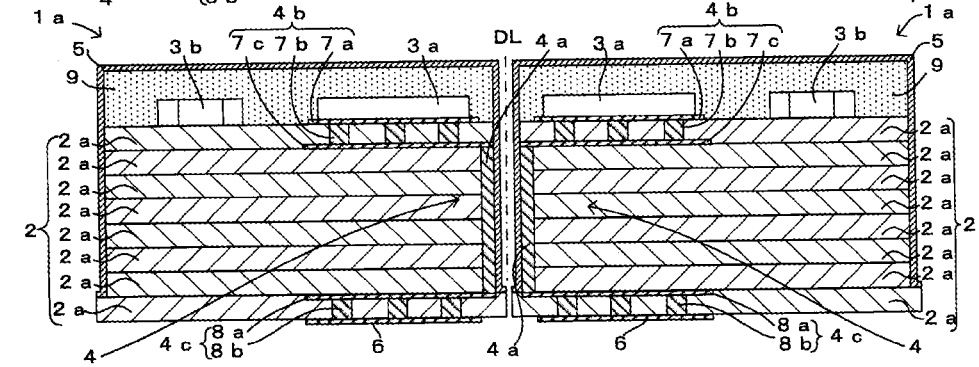

Finally, as shown in FIG. 2D, by cutting the remaining insulation layers 2a (the insulation layers 2a in the lowermost layer) with a dicing machine, individualization of the modules is carried out and each individual module 1a is completed. Here, the individualization of the modules may be carried out in a manner in which a shallow groove is formed on the dicing line DL in the rear surface of the wiring substrates 2 and then the modules break into individual pieces.

As such, in the embodiment, since the radiator 4 as a heat dissipation mechanism is provided in the wiring substrate 2, the heat generated from the electronic component 3a can be dissipated with the radiator 4. In addition, since the heat dissipation section 4a of the radiator 4 is provided so that a part thereof is exposed to the side surface of the wiring substrate 2, the heat of the electronic component 3a can be dissipated through the side surface of the wiring substrate 2. In other words, it is unnecessary to provide thermal vias passing through the wiring substrate immediately under the electronic component like in the existing technique, which makes it possible to suppress the accumulation of heat inside the wiring substrate 2 during the heat from the electronic component 3a being dissipated.

Further, since the heat dissipation section 4a is in contact with the electromagnetic shield member 5 having high thermal conductivity, the heat dissipation characteristics for dissipating the heat of the electronic component 3a can be improved.

By grounding the electromagnetic shield member 5, the shield characteristics thereof are improved. Accordingly, in general, the electromagnetic shield member 5 is connected to a ground electrode. As such, in the existing techniques, a method in which a ground electrode (in-plane conductor) is so formed inside a wiring substrate as to reach a side surface of the wiring substrate so that the ground electrode exposed to the side surface of the wiring substrate is connected to an electromagnetic shield member is employed in some case. In this case, because a connection area between the ground electrode and the electromagnetic shield member is small, the connection reliability is low. In contrast, because the configuration of this embodiment is such that the electromagnetic shield member 5 is connected to the exposure surface of the heat dissipation section 4a, a connection area therebetween can be made wide so that the connection reliability can be improved. Further, because the widened connection area between the heat dissipation section 4a and the electromagnetic shield member 5 can lower the connection resistance therebetween, the shield characteristics brought by the electromagnetic shield member 5 are improved.

Further, the heat transfer section 4b is disposed at a position near the upper surface of the wiring substrate 2, and connected, on the upper side of the wiring substrate 2, to the heat dissipation section 4a which is positioned at the side surface of the wiring substrate 2, which makes it possible to easily secure a vacant space in a region immediately under the electronic component 3a of the wiring substrate 2. Accordingly, the degree of freedom in designing the wiring pattern inside the wiring substrate 2 can be increased in comparison with the existing configuration in which thermal vias passing through the wiring substrate 2 are provided. Furthermore, in the heat transfer section 4b, the heat transfer conductor film 7c formed inside the wiring substrate 2 (on the upper surface of the second insulation layer 2a from top) is connected to the heat dissipation section 4a. This increases the degree of freedom in designing a mounting surface (upper surface) of the wiring substrate 2 in comparison with a case in which the contact conductor film 7a is extended to the side surface of the wiring substrate 2 and connected to the heat dissipation section 4a.

Because the radiator 4 is connected to the ground electrode 6 which is connected to a ground electrode of the mother board, the heat from the electronic component 3a can be dissipated toward the mother board side as well.

<Second Embodiment>

Figure 3:
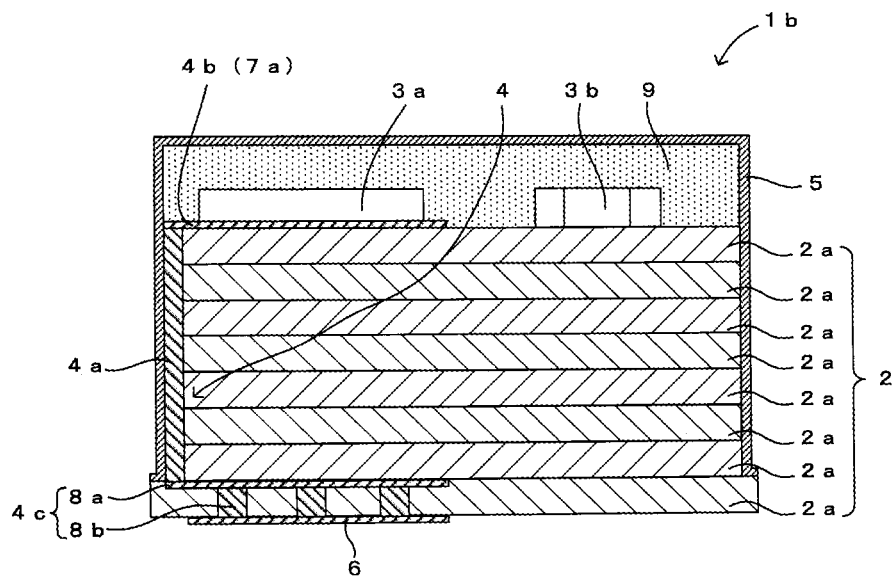
FIG. 3 is a cross-sectional view of a module according to a second embodiment of the present disclosure.

A module 1b according to a second embodiment of the present disclosure will be described with reference to FIG. 3. FIG. 3 is a cross-sectional view of the module 1b.

The module 1b according to the second embodiment differs from the module 1a of the first embodiment having been described with reference to FIG. 1 in that, as shown in FIG. 3, the configurations of a heat dissipation section 4a and a heat transfer section 4b of a radiator 4 are different. Because other constituent configurations are the same as those of the module 1a of the first embodiment, the same reference signs are assigned and description thereof will be omitted.

In this case, an upper end of the heat dissipation section 4a is so formed as to be exposed to an upper surface of a wiring substrate 2. Meanwhile, the heat transfer section 4b is configured of only a contact conductor film 7a. The contact conductor film 7a is formed extending toward the side of a side surface of the wiring substrate 2 so as to reach a position where the contact conductor film 7a can be connected to the upper end of the heat dissipation section 4a.

With this configuration, a design space inside the wiring substrate 2 can be made wider by an amount of a space produced due to not providing the via conductors 7b and the heat transfer conductor film 7c in the heat transfer section 4b. In addition, the heat transfer section 4b forming a part of the heat dissipation path does not pass through the inside of the wiring substrate 2, thereby making it possible to reduce the accumulation of heat inside the wiring substrate 2.

<Third Embodiment>

Figure 4:
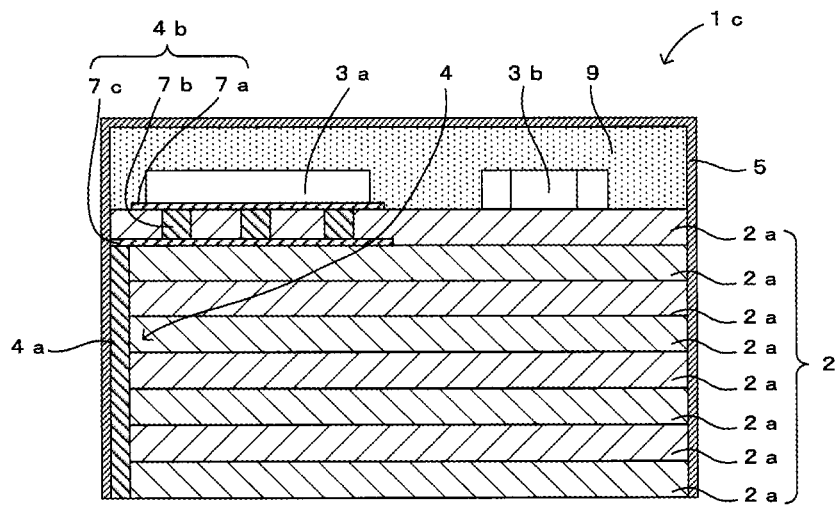
FIG. 4 is a cross-sectional view of a module according to a third embodiment of the present disclosure.

A module 1c according to a third embodiment of the present disclosure will be described with reference to FIG. 4. FIG. 4 is a cross-sectional view of the module 1c.

The module 1c according to the third embodiment differs from the module 1a of the first embodiment having been described with reference to FIG. 1 in that, as shown in FIG. 4, the connection section 4c is not provided in a radiator 4, the configuration of a heat dissipation section 4a is different, and the ground electrode 6 is not provided. Because other constituent configurations are the same as those of the module 1a of the first embodiment, the same reference signs are assigned and description thereof will be omitted.

In this case, although the connection section 4c is not provided in the radiator 4, a lower end of the heat dissipation section 4a is formed being extended so as to be exposed to a lower surface of the wiring substrate 2 instead. Then, the lower end of the heat dissipation section 4a is connected to the ground electrode of the mother board with solder or the like.

With this configuration, a design space inside the wiring substrate 2 can be made wider by an amount of a space produced due to not providing the connection section 4c. In addition, because a part of the heat dissipation path (connection section 4c) passing through the inside of the wiring board 2 is not present, the accumulation of heat inside the wiring substrate 2 can be reduced.

<Fourth Embodiment>

Figure 5:
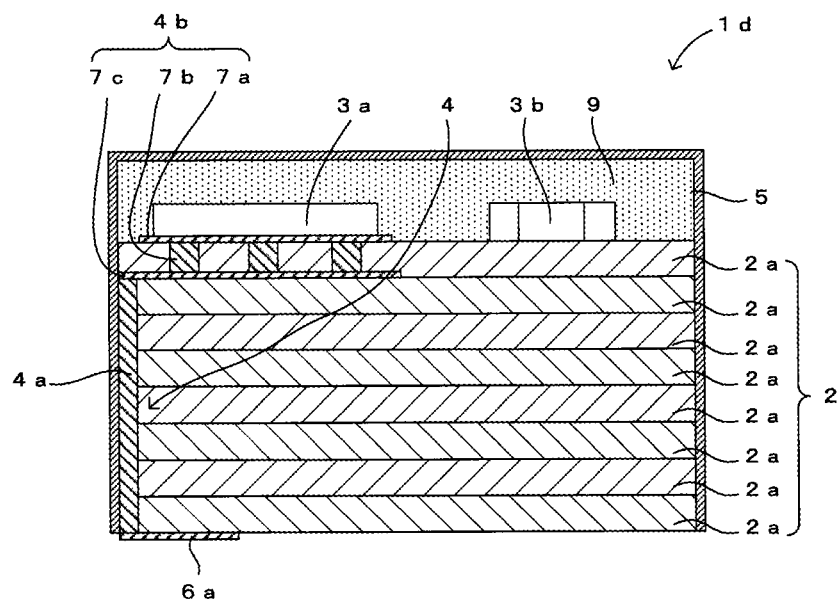
FIG. 5 is a cross-sectional view of a module according to a fourth embodiment of the present disclosure.

A module 1d according to a fourth embodiment of the present disclosure will be described with reference to FIG. 5. FIG. 5 is a cross-sectional view of the module 1d.

The module 1d according to the fourth embodiment differs from the module 1c of the third embodiment having been described with reference to FIG. 4 in that, as shown in FIG. 5, a ground electrode 6a for external connection is provided on a lower surface of a wiring substrate 2. Because other constituent configurations are the same as those of the module 1c of the third embodiment, the same reference signs are assigned and description thereof will be omitted.

With this configuration, the same effects as those of the module 1c of the third embodiment can be obtained. In addition, because the ground electrode 6a is provided on the lower surface of the wiring substrate 2, a connection area with the ground electrode of the mother board can be widened in comparison with the module 1c of the third embodiment.

<Fifth Embodiment>

Figure 6:
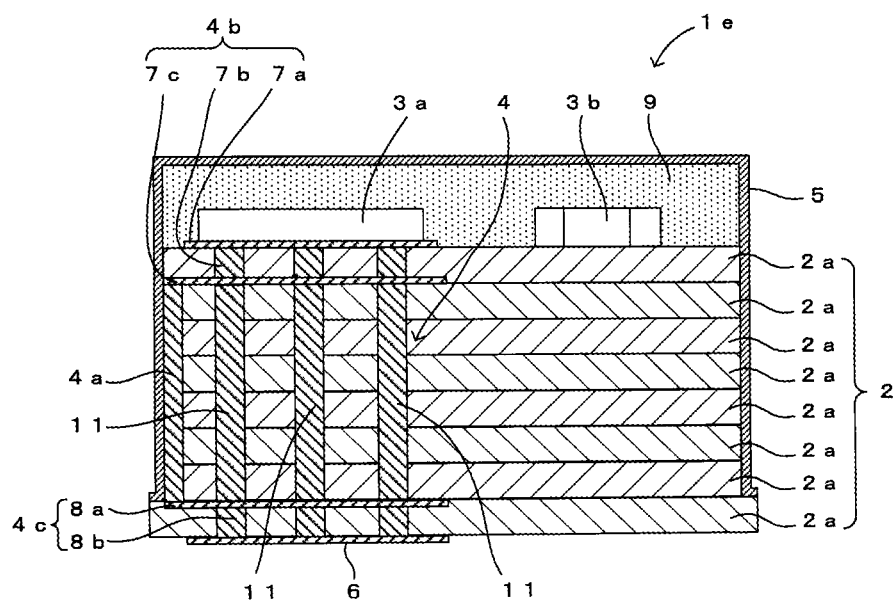
FIG. 6 is a cross-sectional view of a module according to a fifth embodiment of the present disclosure.
Figure 7:
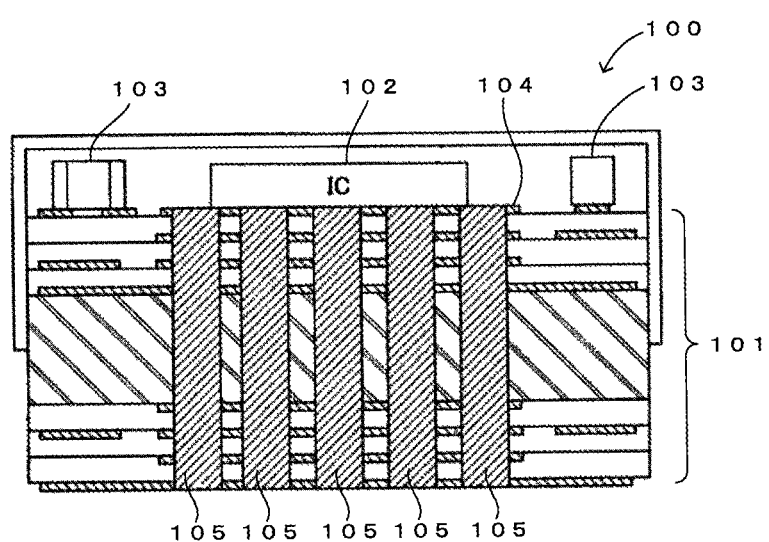
FIG. 7 is a cross-sectional view of an existing module.

A module 1e according to a fifth embodiment of the present disclosure will be described with reference to FIG. 6. FIG. 6 is a cross-sectional view of the module 1e.

The module 1e according to the fifth embodiment differs from the module 1a of the first embodiment having been described with reference to FIG. 1 in that a radiator 4 additionally includes a plurality of heat dissipation via conductors 11 as shown in FIG. 6. Because other constituent configurations are the same as those of the module 1a of the first embodiment, the same reference signs are assigned and description thereof will be omitted.

In this case, the plurality of heat dissipation via conductors 11 passing through insulation layers 2a that are disposed between a heat transfer conductor film 7c and a connection conductor film 8a, are provided immediately under an electronic component 3a. An upper end of each of the heat dissipation via conductors 11 is connected to the heat transfer conductor film 7c while a lower end thereof is connected to the connection conductor film 8a.

With this configuration, because the number of heat dissipation paths is increased due to the heat dissipation via conductors 11, the heat transfer characteristics for the heat generated from the electronic component 3a can be further improved. Note that in this case, although the heat from the electronic component 3a passes through the inside of a wiring substrate 2 like in the existing module 100, the heat accumulated inside the wiring substrate 2 can be reduced in comparison with the existing module 1a because a part of the heat from the electronic component 3a is dissipated through a heat dissipation section 4a.

The present disclosure is not limited to the above-described embodiments, and various modifications can be carried out in addition to the above-described embodiments without departing from the spirit and scope of the disclosure. For example, the electromagnetic shield member 5 may not be provided in the respective embodiments.

Further, in the case where the radiator 4 need not be electrically connected to the ground electrode 6, the electromagnetic shield member 5, and the like, it is unnecessary to use a conductor for forming the radiator 4 and a material having high thermal conductivity may be used instead.

The wiring substrate 2 may have a single-layer structure.

The present disclosure can be widely applied to various types of modules in which a radiator configured to dissipate heat generated from an electronic component is provided in or on a wiring substrate.

1a-1e MODULE
2 WIRING SUBSTRATE
2a INSULATION LAYER
3a, 3b ELECTRONIC COMPONENT
4 RADIATOR
4a HEAT DISSIPATION SECTION (PASSING-THROUGH CONDUCTOR)
4b HEAT TRANSFER SECTION
4c CONNECTION SECTION
5 ELECTROMAGNETIC SHIELD MEMBER
6, 6a GROUND ELECTRODE
7c HEAT TRANSFER CONDUCTOR FILM (IN-PLANE CONDUCTOR)

The invention claimed is:

1. A module comprising:
   a wiring substrate comprising a plurality of laminated insulation layers;
   an electronic component mounted on one principal surface of the wiring substrate; and
   a radiator provided in or on the wiring substrate and electrically insulated from the electronic component while a part of the radiator being in contact with the electronic component,
   wherein the radiator includes a heat dissipation section comprising a passing-through conductor passing through at least one of the insulation layers,
   a part of the heat dissipation section is exposed to a side surface of the wiring substrate, and
   the electronic component is configured of a semiconductor device and includes a heat generation component, and
   the heat generation component is located at a position near the side surface of the wiring substrate.

2. The module according to claim 1, further comprising:
   an electromagnetic shield member for the electronic component,
   wherein the part of the heat dissipation section is in contact with the electromagnetic shield member.

3. The module according to claim 1,
   wherein the radiator includes a heat transfer section, and the heat transfer section is disposed at a position near the one principal surface of the wiring substrate and transfers heat of the electronic component to the heat dissipation section.

4. The module according to claim 3,
   wherein the heat transfer section includes an in-plane conductor, and the in-plane conductor is provided on a boundary between one of the insulation layers including the one principal surface of the wiring substrate and another one of the insulation layers adjacent to the one of the insulation layers, and
   the in-plane conductor is connected to the heat dissipation section.

5. The module according to claim 1,
   wherein the radiator includes a connection section, and the connection section is configured to connect the heat dissipation section to a ground electrode for external connection provided on the other principal surface of the wiring substrate.

6. The module according to claim 2,
   wherein the radiator includes a heat transfer section, and the heat transfer section is disposed at a position near the one principal surface of the wiring substrate and transfers heat of the electronic component to the heat dissipation section.

7. The module according to claim 2,
   wherein the radiator includes a connection section, and the connection section is configured to connect the heat dissipation section to a ground electrode for external connection provided on the other principal surface of the wiring substrate.

8. The module according to claim 3,
   wherein the radiator includes a connection section, and the connection section is configured to connect the heat dissipation section to a ground electrode for external connection provided on the other principal surface of the wiring substrate.

9. The module according to claim 4,
wherein the radiator includes a connection section, and
the connection section is configured to connect the heat dissipation section to a ground electrode for external connection provided on the other principal surface of the wiring substrate.

\* \* \* \* \*